(12) United States Patent
Beach et al.

(10) Patent No.: US 9,117,671 B2
(45) Date of Patent: *Aug. 25, 2015

(54) FABRICATION OF III-NITRIDE SEMICONDUCTOR DEVICE AND RELATED STRUCTURES

(71) Applicant: International Rectifier Corporation, El Segundo, CA (US)

(72) Inventors: Robert Beach, La Crescenta, CA (US); Michael A. Briere, Scottsdale, AZ (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,449

(22) Filed: Oct. 15, 2014

(65) Prior Publication Data

US 2015/0037965 A1 Feb. 5, 2015

Related U.S. Application Data

(63) Continuation of application No. 14/135,425, filed on Dec. 19, 2013, now Pat. No. 8,865,575, which is a continuation of application No. 11/534,855, filed on Sep. 25, 2006, now Pat. No. 8,614,129.

(60) Provisional application No. 60/722,510, filed on Sep. 30, 2005.

(51) Int. Cl.
*H01L 21/02* (2006.01)
*H01L 29/66* (2006.01)
*H01L 29/778* (2006.01)
*H01L 29/20* (2006.01)

(52) U.S. Cl.
CPC ........ *H01L 21/0254* (2013.01); *H01L 21/0242* (2013.01); *H01L 21/0262* (2013.01); *H01L 21/02378* (2013.01); *H01L 21/02381* (2013.01); *H01L 21/02458* (2013.01); *H01L 21/02502* (2013.01); *H01L 21/02507* (2013.01); *H01L 21/02631* (2013.01); *H01L 29/66462* (2013.01); *H01L 29/7787* (2013.01); *H01L 21/02425* (2013.01); *H01L 29/2003* (2013.01)

(58) Field of Classification Search
CPC ..................... H01L 21/0262; H01L 21/02532; H01L 21/02381; H01L 21/0254
USPC .................................................. 438/478, 479
See application file for complete search history.

(56) References Cited

U.S. PATENT DOCUMENTS 8,865,575 B2 * 10/2014 Beach et al. .................. 438/478

* cited by examiner

*Primary Examiner* — Monica D Harrison
(74) *Attorney, Agent, or Firm* — Farjami & Farjami LLP

(57) ABSTRACT

A method of fabricating a III-nitride power semiconductor device that includes growing a transition layer over a substrate using at least two distinct and different growth methods.

20 Claims, 2 Drawing Sheets

FABRICATION OF III-NITRIDE SEMICONDUCTOR DEVICE AND RELATED STRUCTURES

This is a continuation of application Ser. No. 11/534,855 filed Sep. 25, 2006.

RELATED APPLICATION

This application claims benefit of U.S. Provisional Application Ser. No. 60/722,510, filed Sep. 30, 2005, entitled Method for Improving the Quality of an Aluminum Nitride Layer in a III-Nitride Semiconductor Device, to which a claim of priority is hereby made and the disclosure of which is incorporated by reference.

FIELD OF THE INVENTION

The present invention relates to a method for fabricating a semiconductor device.

BACKGROUND OF THE INVENTION

The present invention relates to semiconductor devices and more particularly to III-nitride semiconductor devices and methods of fabricating III-nitride semiconductor devices.

A III-V semiconductor is a semiconductor material that is composed of a group III element and a group V element. III-V semiconductors are desirable for power applications, but have not been exploited extensively due in part to difficulties in fabrication.

For example, one commercially desirable III-V semiconductor is III-nitride. Note that as used herein III-nitride semiconductor or GaN-based semiconductor refers to a semiconductor alloy from the InAlGaN system. Examples of alloys from the InAlGaN system include GaN, AlGaN, AlN, InN, InGaN, and InAlGaN. Note that while nitrogen is present in each alloy, the presence and proportion of In, Al, or Ga can be varied to obtain an alloy in the InAlGaN system.

III-nitride semiconductor devices are desirable for power applications due in large part to the high band gap of III-nitride semiconductor materials. To fabricate a III-nitride semiconductor device at least one III-nitride semiconductor alloy (i.e. an alloy from the InAlGaN system) needs to be formed over a substrate. The three well known substrate materials for III-nitride semiconductor devices are sapphire, SiC and Si.

Silicon substrates are more desirable commercially because of low cost, and high thermal conductivity. However, due to lattice mismatch and differences in the thermal expansion characteristics of III-nitride semiconductor alloys and silicon, thick III-nitride semiconductor layers (e.g. more than 1 micron thick) either crack or cause the silicon wafer to bend. It should be noted that the cracking problem associated with thick III-nitride semiconductor layers is not experienced only when a silicon substrate is used, and thus the problem is not limited to III-nitride semiconductor that is formed on silicon substrates.

To overcome the cracking problem a transition layer is disposed between the active portion of the device and the substrate. Referring thus to FIG. 1, a known III-nitride semiconductor device includes an active semiconductor region 10 formed on transition layer 12, which is formed over substrate 14. Substrate 14 is, for example, a silicon diode.

Active region 20 includes a first III-nitride semiconductor body 16 of one band gap, and a second III-nitride semiconductor body 18 of another band gap forming a heterojunction with first III-nitride semiconductor body 16. A two dimensional electron gas (2DEG) is formed at the heterojunction of first III-nitride semiconductor body 16 and second III-nitride semiconductor body 18 through which current is conducted between first power electrode 20 (e.g. source electrode) and second power electrode 22 (e.g. drain electrode) both electrically coupled to second III-nitride semiconductor body 18. As is well known, application of a proper voltage to gate electrode 24 can disrupt, or restore 2DEG in order to control the current between first power electrode 20 and second power electrode 22.

In order to obtain the best possible control over the current between first power electrode 20, and second power electrode 22, it is desirable to ensure that current cannot find any alternative path but through the 2DEG. It has, however, been observed that current can find a leakage path through transition layer 12 and trough substrate 14, when substrate 14 is electrically conductive.

It is desirable to reduce or eliminate the leakage paths through transition layer 12 in order to improve the switching characteristics of a III-nitride power semiconductor device.

SUMMARY OF THE INVENTION

To reduce or eliminate the leakage paths through the transition layer a method according to the present invention includes growing a first III-nitride layer over a substrate using one growth technique and a second III-nitride layer over the first III-nitride layer using a second distinct growth technique that is different from the first growth technique.

According to another embodiment of the present invention, to form the transition layer a third III-nitride body is grown over the second III-nitride body using a third III-nitride growth technique that is distinct and different from the first and the second growth techniques.

The growth technique that can be used in a fabrication method according to the present invention can be, for example, molecular beam epitaxy (MBE), hydride vapor phase epitaxy (HVPE), and metal organic chemical vapor deposition (MOCVD). These techniques can be applied in any sequence to alternately form III-nitride layers until the desire thickness has been achieved.

Other features and advantages of the present invention will become apparent from the following description of the invention which refers to the accompanying drawings.

DETAILED DESCRIPTION OF THE FIGURES

According to the present invention, in order to reduce the leakage path through the transition layer, the transition layer is grown to its final thickness using at least two distinct growth techniques.

Figure 1:
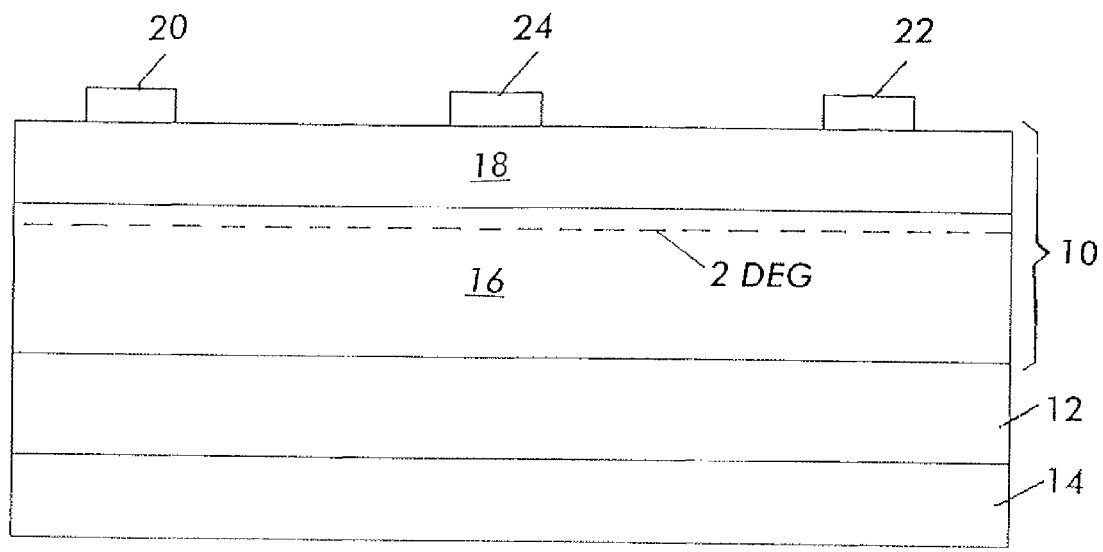
FIG. 1 shows a cross-sectional view of a III-nitride semiconductor device according to the prior art.
Figure 2:
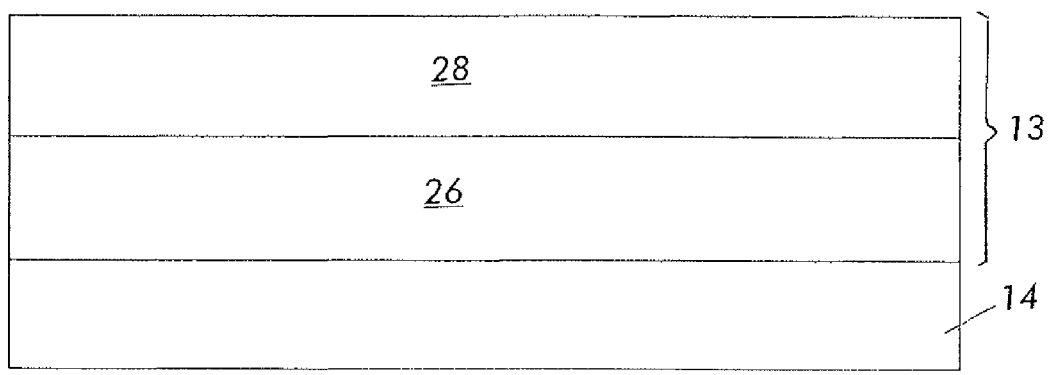
FIG. 2 illustrates a portion of a semiconductor device fabricated according to the first embodiment of the present invention.
Figure 3:
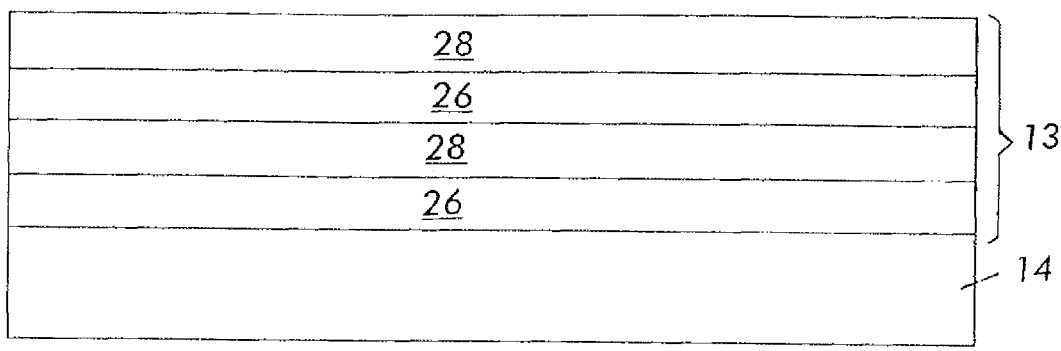
FIG. 3 illustrates a portion of a semiconductor device fabricated according to a variation of the first embodiment of the present invention.

Referring to FIG. 1, in a first embodiment of the present invention a transition layer 13 is grown over a major surface of a conductive substrate (e.g. Si, or SiC) by growing a first III-nitride layer 26 using a first growth method, and then growing a second III-nitride layer 28 over first III-nitride layer 26 using a second distinct and different method of growth. Thereafter, an active region can be grown over transition layer 13 fabricated according to the present invention.

A growth method that can be used in a fabrication method according to the present invention can be, for example, MBE, HVPE, and MOCVD. These methods can be alternated in any desired manner. Table 1 provides a few possible combinations.

TABLE 1

|  | Ex. 1 | Ex. 2 | Ex. 3 | Ex. 4 | Ex. 5 | Ex. 6 |
|---|---|---|---|---|---|---|
| First III-nitride layer 26 | MBE | MBE | HVPE | HVPE | MOCVD | MOCVD |
| Second III-nitride layer 28 | HVPE | MOCVD | MBE | MOCVD | HVPE | MBE |

It should be noted that transition layer 13 fabricated according to the present invention is not restricted to two layers. Rather, it may include multiple layers of first III-nitride semiconductor layers 26 and second III-nitride semiconductor layers 28 alternately formed using distinct and different growth techniques.

Figure 4:
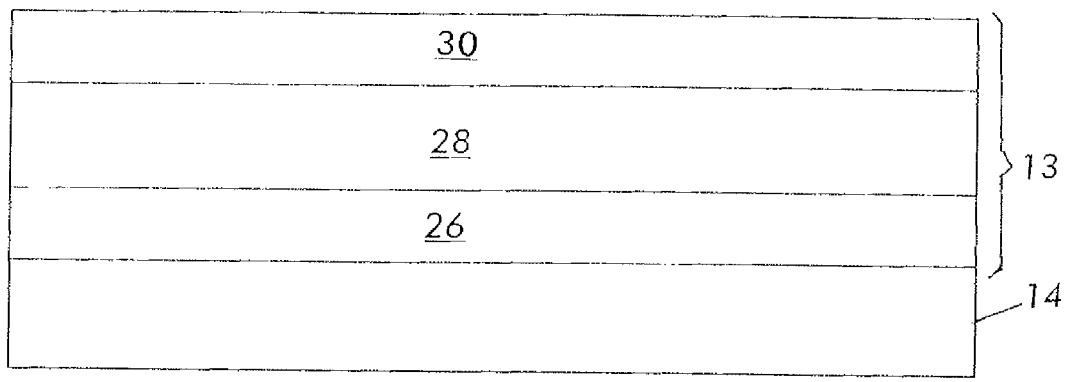
FIG. 4 illustrates a portion of a semiconductor device fabricated according to the second embodiment of the present invention.

Referring now to FIG. 4, in a method according to another embodiment of the present invention, transition layer 13 includes first III-nitride layer 26 grown using a first growth technique, second III-nitride layer 28 formed over first III-nitride layer 26 using a second growth technique distinct and different from the first growth technique, and third III-nitride layer 30 formed over second III-nitride layer 28 using a growth technique distinct and different from first growth technique and second growth technique. A distinct growth technique which may be used to form a transition layer 13 according to the present invention can be, for example, MBE, HVPE, and MOCVD. These methods can be alternated in any desired sequence. Table 2 illustrates some possible examples.

TABLE 2

|  | Ex. 1 | Ex. 2 | Ex. 3 | Ex. 4 | Ex. 5 | Ex. 6 |
|---|---|---|---|---|---|---|
| First III-nitride layer 26 | MBE | MBE | MOCVD | MOCVD | HVPE | HVPE |
| Second III-nitride layer 28 | HVPE | MOCVD | MBE | HVPE | MBE | MOCVD |
| Third III-nitride layer 30 | MOCVD | HVPE | HVPE | MBE | MOCVD | MBE |

Figure 5:
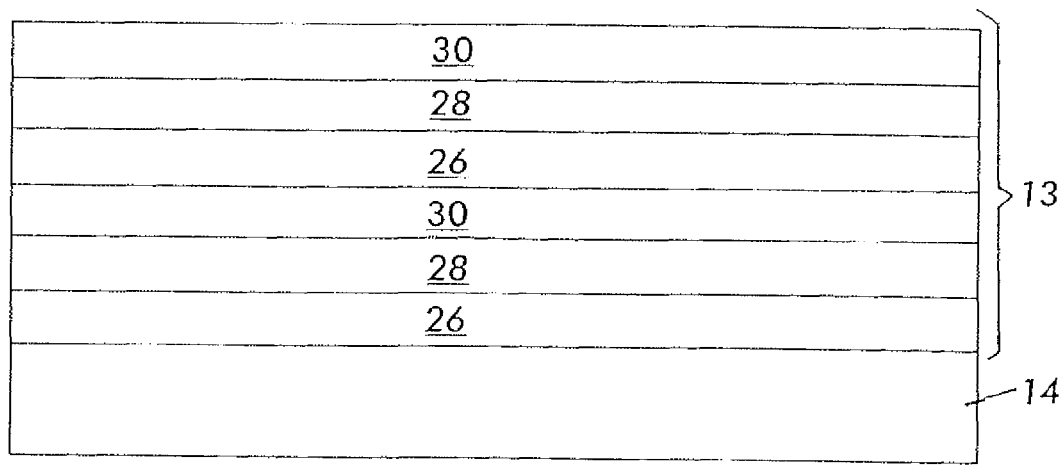
FIG. 5 illustrates a portion of a semiconductor device fabricated according to a variation of the second embodiment of the present invention.

It should be noted that transition layer 13 is not restricted to first III-nitride layer 26, second III-nitride layer 28, and III-nitride layer 30. Referring to FIG. 5, for example, transition layer 13 can include a plurality of first III-nitride layers 26, a plurality of second III-nitride layers 28, and a plurality of third III-nitride layers grown alternately.

Note that although FIG. 5 shows a sequence including first III-nitride layer 26, second III-nitride layer 28, third III-nitride layer 30, first III-nitride layer 26, second III-nitride layer 28, third III-nitride layer 30, a transition layer according to the present invention can be grown using any growth sequence.

For example, transition layer may be formed to have the sequence layer 26, layer 28, layer 30, layer 28, layer 26, layer 30, and so on.

Note that the preferred material for a transition layer according to the present invention is AlN. Thus, each III-nitride layer in a transition layer 13 grown according to the present invention may be comprised of AlN grown according to a distinct, and different method.

Note also that each III-nitride layer in a transition layer 13 may have a uniform composition, or a varying composition (e.g. graded composition). Moreover, each III-nitride layer can have a different composition. For example, in a transition layer 13 first III-nitride layer 26 may have a uniform composition, second III-nitride layer 28 may have a graded composition, and third III-nitride layer 30 may have a composition that varies in discrete steps rather than smoothly and gradually as would be the case in a graded composition.

A device fabricated according to the present invention would include an active region formed over transition layer 13 that is grown according to the present invention. The active region may include a III-nitride heterojunction similar to the heterojunction detailed above with reference to FIG. 1, or it may be any other type of device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a power semiconductor device, comprising:
    providing a substrate;
    growing a first III-nitride layer using a first growth method selected from the group consisting of MBE and HVPE, and a second III-nitride layer over said at least first III-nitride layer, and a third III-nitride layer over said second III-nitride layer;
    forming an active semiconductor region over said third III-nitride layer, wherein at least one of said first, second, and third III-nitride layers act to transition lattice mismatch between said substrate and said active semiconductor region.

2. The method of claim 1, wherein said second III-nitride layer is fabricated using a second growth method selected from the group consisting of MOCVD and HVPE.

3. The method of claim 1, wherein said third III-nitride layer is fabricated using an MOCVD growth method.

4. The method of claim 1, wherein at least one of said first, second, and third III-nitride layers further act to transition thermal expansion characteristics between said substrate and said active semiconductor region.

5. The method of claim 1, wherein said active semiconductor region comprises first and second III-nitride semiconductor bodies.

6. The method of claim 1, wherein said substrate comprises material selected from the group consisting of silicon, silicon carbide, and sapphire.

7. The method of claim 1, wherein said first growth method is MBE and said second growth method is HVPE.

8. The method of claim 1, wherein said first III-nitride layer has a uniform composition.

9. The method of claim 1, wherein said first III-nitride layer has a graded composition.

10. The method of claim 1, wherein said second III-nitride layer has a uniform composition.

11. The method of claim 1, wherein said second III-nitride layer has a graded composition.

12. A method of fabricating a power semiconductor device, comprising:
providing a substrate;
growing a first III-nitride layer using a first growth method selected from the group consisting of MBE and MOCVD, and a second III-nitride layer over said at least first III-nitride layer, and a third III-nitride layer over said second III-nitride layer;
forming an active semiconductor region over said third III-nitride layer, wherein at least one of said first, second, and third III-nitride layers act to transition lattice mismatch between said substrate and said active semiconductor region.

13. The method of claim 12, wherein said second III-nitride layer is fabricated using a HVPE growth method.

14. The method of claim 12, wherein said third III-nitride layer is fabricated using an MOCVD growth method.

15. The method of claim 12, wherein said substrate comprises material selected from the group consisting of silicon, silicon carbide, and sapphire.

16. The method of claim 12, wherein said first growth method is MOCVD and said second growth method is HVPE.

17. The method of claim 12, wherein said first III-nitride layer has a uniform composition.

18. The method of claim 12, wherein said first III-nitride layer has a graded composition.

19. The method of claim 12, wherein said second III-nitride layer has a uniform composition.

20. The method of claim 12, wherein said second III-nitride layer has a graded composition.

* * * * *